(12) United States Patent
Reinhard et al.

(10) Patent No.: US 10,109,761 B2
(45) Date of Patent: Oct. 23, 2018

(54) FABRICATING THIN-FILM OPTOELECTRONIC DEVICES WITH MODIFIED SURFACE

(71) Applicants: FLISOM AG, Duebendorf (CH); EMPA, Duebendorf (CH)

(72) Inventors: Patrick Reinhard, Zurich (CH); Fabian Pianezzi, Dübendorf (CH); Benjamin Bissig, Altdorf (CH); Stephan Buecheler, Dachsberg (DE); Ayodhya Nath Tiwari, Meilen (CH)

(73) Assignees: FLISOM AG, Duebendorf (CH); EMPA, Duebendorf (CH)

( * ) Notice: Subject to any disclaimer, the term of this patent is extended or adjusted under 35 U.S.C. 154(b) by 0 days.

(21) Appl. No.: 15/312,718

(22) PCT Filed: May 21, 2015

(86) PCT No.: PCT/IB2015/053736
§ 371 (c)(1),
(2) Date: Nov. 21, 2016

(87) PCT Pub. No.: WO2015/177748
PCT Pub. Date: Nov. 26, 2015

(65) Prior Publication Data
US 2017/0133547 A1    May 11, 2017

(30) Foreign Application Priority Data

May 23, 2014 (WO) ................. PCT/IB2014/061651

(51) Int. Cl.
*H01L 31/18* (2006.01)
*H01L 31/0392* (2006.01)
(Continued)

(52) U.S. Cl.
CPC .... *H01L 31/186* (2013.01); *H01L 31/022425* (2013.01); *H01L 31/0322* (2013.01);
(Continued)

(58) Field of Classification Search
CPC ............ H01L 31/0322; H01L 31/0323; H01L 31/186; H01L 33/186
See application file for complete search history.

(56) References Cited

U.S. PATENT DOCUMENTS

| | | |
|---|---|---|
| 4,332,880 A | 6/1982 | Izu et al. |
| 4,335,266 A | 6/1982 | Mickelsen et al. |

(Continued)

FOREIGN PATENT DOCUMENTS

| | | |
|---|---|---|
| DE | 442824 C | 5/1927 |
| DE | 10259258 A1 | 7/2004 |

(Continued)

OTHER PUBLICATIONS

R. Wuerz et al. "CIGS Thin-Film Solar Cells and Modules on Enamelled Steel Substrates", Solar Energy Materials & Solar Cells. 2012.

(Continued)

*Primary Examiner* — Jose R Diaz
(74) *Attorney, Agent, or Firm* — Patterson & Sheridan, LLP (57) ABSTRACT

A method (200) for fabricating thin-film optoelectronic devices (100), the method comprising: providing a substrate (110), forming a back-contact layer (120); forming at least one absorber layer (130) made of an ABC chalcogenide material, adding at least one alkali metal (235), and forming at least one cavity (236, 610, 612, 613) at the surface of the absorber layer wherein forming of said at least one cavity is by dissolving away from said surface of the absorber layer at least one crystal aggregate comprising at least one alkali (Continued)

crystal comprising at least one alkali metal. The method (200) is advantageous for more environmentally-friendly production of photovoltaic devices (100) on flexible substrates with high photovoltaic conversion efficiency and faster production rate.

19 Claims, 5 Drawing Sheets

(51) Int. Cl.
  *H01L 31/032* (2006.01)
  *H01L 31/0445* (2014.01)
  *H01L 31/0352* (2006.01)
  *H01L 31/0224* (2006.01)

(52) U.S. Cl.
  CPC .... *H01L 31/0323* (2013.01); *H01L 31/03529* (2013.01); *H01L 31/03926* (2013.01); *H01L 31/0445* (2014.12)

(56) References Cited

U.S. PATENT DOCUMENTS

| | | | |
|---|---|---|---|
| 4,465,575 A | 8/1984 | Love et al. | |
| 4,961,829 A | 10/1990 | Mainzer et al. | |
| 5,141,564 A | 8/1992 | Chen et al. | |
| 5,441,897 A | 8/1995 | Noufi et al. | |
| 6,092,669 A | 7/2000 | Kushiya et al. | |
| 6,258,620 B1 | 7/2001 | Morel et al. | |
| 6,441,301 B1 | 8/2002 | Satoh et al. | |
| 7,785,921 B1 | 8/2010 | Juliano et al. | |
| 7,989,256 B2 | 8/2011 | Hakuma et al. | |
| 8,193,028 B2 | 6/2012 | Lee | |
| 8,404,512 B1 | 3/2013 | Aksu et al. | |
| 8,415,557 B2 | 4/2013 | Fukunaga et al. | |
| 2002/0106873 A1 | 8/2002 | Beck et al. | |
| 2004/0063320 A1 | 4/2004 | Hollars | |
| 2005/0202589 A1 | 9/2005 | Basol | |
| 2006/0096635 A1 | 5/2006 | Tuttle | |
| 2006/0145190 A1 | 7/2006 | Salzman et al. | |
| 2008/0012006 A1 | 1/2008 | Bailey et al. | |
| 2008/0023336 A1 | 1/2008 | Basol | |
| 2008/0169025 A1 | 7/2008 | Basol et al. | |
| 2008/0210295 A1 | 9/2008 | Basol | |
| 2009/0092744 A1 | 4/2009 | Pinarbasi et al. | |
| 2010/0229936 A1 | 9/2010 | Yago et al. | |
| 2010/0248420 A1 | 9/2010 | Okamura et al. | |
| 2010/0258191 A1 | 10/2010 | Mackie | |
| 2011/0073186 A1 | 3/2011 | Lai et al. | |
| 2011/0177645 A1 | 7/2011 | Vasquez et al. | |
| 2011/0186102 A1 | 8/2011 | Kobayashi et al. | |
| 2012/0006395 A1 | 1/2012 | Boussaad et al. | |
| 2012/0064352 A1 | 3/2012 | Boussaad et al. | |
| 2012/0080091 A1 | 4/2012 | Min et al. | |
| 2012/0180870 A1 | 7/2012 | Yamamoto | |
| 2012/0214293 A1 | 8/2012 | Aksu et al. | |
| 2012/0258567 A1 | 10/2012 | Aksu et al. | |
| 2012/0313200 A1 | 12/2012 | Jackrel et al. | |
| 2013/0160831 A1 | 6/2013 | Zubeck et al. | |
| 2017/0243993 A1* | 8/2017 | Reinhard | H01L 31/0322 |

FOREIGN PATENT DOCUMENTS

| | | |
|---|---|---|
| EP | 743686 A2 | 11/1996 |
| EP | 787354 A1 | 8/1997 |
| EP | 826983 A1 | 3/1998 |
| EP | 1291932 A2 | 3/2003 |
| EP | 2309548 A2 | 4/2011 |
| EP | 2339641 A2 | 6/2011 |
| EP | 2408023 A1 | 1/2012 |
| EP | 2463929 A1 | 6/2012 |
| WO | 2006076788 A1 | 7/2006 |
| WO | 2007072023 A1 | 6/2007 |
| WO | 2008088570 A1 | 7/2008 |
| WO | 2009076403 A1 | 6/2009 |
| WO | 2010/106534 A1 | 9/2010 |
| WO | 2011040645 A1 | 4/2011 |
| WO | 2012037242 A2 | 3/2012 |

OTHER PUBLICATIONS

Rudmann, D. (2004) Effects of sodium on growth and properties of Cu(In,Ga)Se2 thin films and solar cells, Doctoral Dissertation, Swiss Federal Institute of Technology. Retrieved Sep. 17, 2012 from <URL: http://e-collection.ethbib.ethz.ch/eserv/eth:27376/eth-27376-02.pdf>.

Contreras et al. (1997) On the Role of Na and Modifications to Cu(In,Ga)Se2 Absorber Materials Using Thin-MF (M=Na, K, Cs) Precursor Layers, NREL/CP-520-22945.

Chinese Office Action dated Aug. 19, 2015 for Application No. 201280012915.3.

Chirila et al. (2011) Nature Materials 10, 857-861.

Johnson et al. (2002) Interface Properties of CIGS(s)/Buffer Layers Formed by the Cd-Partial Electrolyte Process, 29 th IEEE PVSC, May 20-24, 2002.

Ku et al. (2011) A novel one-step electrodeposition to prepare single-phase CuInS 2 thin films for solar cells, Solar Energy Materials & Solar Cells 95 (2011) 791-796.

Zhang et al. (2003) Formation of CuInSe 2 and Cu(In,Ga)Se 2 films by electrodeposition and vacuum annealing treatment, Solar Energy Materials & Solar Cells 80 (2003) 483-490.

International Search Report and Written Opinion for PCT/IB2015/053736, dated Nov. 27, 2015.

Adrian Chirila, et al., "Potassium-Induced Surface Modification of Cu(In, Ga)Se2 Thin Films for High-Efficiency Solar Cells," Nature Materials, vol. 12. No. 12, Nov. 3, 2013, pp. 1107-1111.

Cojocaru-Miredin O., et al. "Exploring the P—N Junction Region OIN Cu(In,Ga) Sethin-Film Solar Cells at the Nanmeter-Scale," Applied Physics Letters, American Institute of Physics, US, vol. 101, No. 18, Oct. 29, 2012, pp. 181603-3.

Pyuck-Pa Choi, et al., "Compositional Gradients and Impurity Distributions in CuInSe2 Thin Film Solar Cells Studied by Atom Probe Tomography," Surface and Interface Analysis, vol. 44, No. 11-12, Nov. 18, 2012, pp. 1386-1388.

Hunger, R., et al., "Removal of the Surface Investion of CuInSe2 Absorbers by NH3, aq Etchings," Proceedings of the 3rd World Conference on Photovoltaic Energy Conversion: Joint Conference of 13th PV Science & Engineering Conference, 30th IEEE PV Specialists Conference, 18th European PV Solar Energy Conference, May 18, 2003, pp. 556-569.

Balboul, M.R., et al., "Sodium Induced Phase Segregations in CuGaSe2 and CuInSe2 Thin Films," 17th E.C. Photovoltaic Solar Energy Conferenc, Munich Germany, Oct. 22-26, 2001; Proceedings of the International Photovoltaic Solar Energy Conference, Munich: WIP-Renewable Energies, DR vol. Conf. 17, Oct. 22, 2001, pp. 1015-1018.

Zribi, M. et al., "Optical Constants of Na-Doped CuInS2 Thin Films," Material Letters vol. 60, No. 1, Jan. 1, 2006, pp. 98-103.

Jehl, Z, et al., "Insights on the Influence of Surface Roughness on Photovoltaic Properties of State of the Art Copper Indium Gallium Diselenide Thin Films Solar Cells," Journal of Applied Physics, American Institute of Physics, US, vol. 111, No. 11, Jun. 1, 2012, pp. 114509-1-114509-7.

* cited by examiner

FABRICATING THIN-FILM OPTOELECTRONIC DEVICES WITH MODIFIED SURFACE

FIELD

The present invention relates to solar cells and/or optoelectronic devices manufactured by deposition of thin-films and more particularly to forming a modified surface of the absorber layer of optoelectronic devices comprising chalcogenide semiconductors or ABC semiconductive compounds.

BACKGROUND

Photovoltaic devices are generally understood as photovoltaic cells or photovoltaic modules. Photovoltaic modules ordinarily comprise arrays of interconnected photovoltaic cells.

A thin-film photovoltaic or optoelectronic device is ordinarily manufactured by depositing material layers onto a substrate. A thin-film photovoltaic device ordinarily comprises a substrate coated by a layer stack comprising a conductive layer stack, at least one absorber layer, optionally at least one buffer layer, and at least one transparent conductive layer stack.

The present invention is concerned with photovoltaic devices comprising an absorber layer generally based on an ABC chalcogenide material, such as an $ABC_2$ chalcopyrite material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. The invention also concerns variations to the ordinary ternary ABC compositions, such as copper-indium-selenide or copper-gallium-selenide, in the form of quaternary, pentanary, or multinary materials such as compounds of copper-(indium, gallium)-(selenium, sulfur), copper-(indium, aluminium)-selenium, copper-(indium, aluminium)-(selenium, sulfur), copper-(zinc, tin)-selenium, copper-(zinc, tin)-(selenium, sulfur), (silver, copper)-(indium, gallium)-selenium, or (silver, copper)-(indium, gallium)-(selenium, sulfur).

The photovoltaic absorber layer of thin-film ABC or $ABC_2$ photovoltaic devices can be manufactured using a variety of methods such as chemical vapor deposition (CVD), physical vapor deposition (PVD), spraying, sintering, sputtering, printing, ion beam, or electroplating. The most common method is based on vapor deposition or co-evaporation within a vacuum chamber ordinarily using multiple evaporation sources. Historically derived from alkali material diffusion using soda lime glass substrates, the effect of adding alkali metals to enhance the efficiency of thin-film $ABC_2$ photovoltaic devices has been described in much prior art (Rudmann, D. (2004) Effects of sodium on growth and properties of $Cu(In,Ga)Se_2$ thin films and solar cells, Doctoral dissertation, Swiss Federal Institute of Technology.)

The present invention presents a method to form nanostructures, such as cavities, at the surface of a photovoltaic device's absorber layer by selectively dissolving alkali crystals embedded within the absorber's surface. The method advantageously uses the cavities to modify the absorber layer surface's chemical composition, enlarge developed total surface, enlarge developed surface adequate for receiving doping elements, and form point contacts with subsequently deposited thin-film layers.

The present invention exploits adding at least one alkali metal to a thin-film optoelectronic device, and especially to its absorber layer. A preferred at least one alkali metal comprises potassium. Adding at least one alkali metal modifies at least the absorber layer's chemical content. It may also modify the physical appearance of the surface of the absorber layer. Further treating of at least the surface of the absorber layer will modify its physical appearance to reveal nanostructures. Treating of absorber surface may for example be done with a bathing apparatus. The invention discloses independent control of separate alkali metals during adding to layers of the optoelectronic device, the treating of the absorber surface, and the resulting chemical and physical modifications to at least one absorber layer of the optoelectronic device. Effects of the invention on at least one of the device's thin-film layers include at least one of doping, passivation of absorber surface, interfaces, grain boundaries, and defects, elemental interdiffusion, forming of point contacts, forming of nanoholes, modification of layer roughness, optical characteristics, and optoelectronic characteristics such as enhanced open circuit voltage and fill factor. The invention's adding of at least one alkali metal and treating absorber surface enables manufacturing of a thinner optimal buffer layer. In some cases a person skilled in the art may advantageously omit manufacturing the buffer layer. This thinner optimal buffer layer results in reduced optical losses, thereby contributing to increase the device's photovoltaic conversion efficiency.

SUMMARY

This invention presents a solution to the problem of manufacturing high efficiency thin-film photovoltaic or optoelectronic devices that comprise an $ABC_2$ chalcopyrite absorber layer. The invention is also applicable to flexible photovoltaic devices with said absorber layer. It is also applicable to devices manufactured onto substrates, such as polyimide, that do not comprise within the substrate alkali metals known to augment photovoltaic conversion efficiency by diffusion into at least the absorber layer.

The invention presents photovoltaic (abbreviated PV) devices that comprise a proportionally large amount of potassium and describes the characteristics of said devices. The invention also presents a method for manufacturing said devices with the advantage of reduced optical losses, reduced carrier recombinations in the absorber and at the interfaces with the absorber, and therefore enhanced photovoltaic conversion efficiency. Although the method is applicable to production on glass, metal, or various coated substrates, the method is especially advantageous for the production of flexible photovoltaic devices based on polymer substrates. Devices manufactured according to said method have higher photovoltaic efficiency and possibly less unwanted material than equivalent devices manufactured using methods described in prior art.

A common problem in the field of thin-film (abbreviated TF) PV devices relates to doping of the photovoltaic absorber layer for increased efficiency. When manufactured onto glass substrates or possibly onto substrates coated with materials comprising alkali metals, the substrate's alkali metals may diffuse into the absorber layer and increase PV conversion efficiency. In the case of substrates, such as polyimide, that do not comprise alkali metals, the alkali-doping elements must be supplied via deposition techniques such as, for example, physical vapor deposition. Alkali metals may for example be supplied as a so-called post deposition treatment. The alkali metals diffuse during the deposition process within and across various TF layers and their interfaces.

Another problem in the field of TF PV devices concerned with doping relates to efficient doping of specific areas or specific zones along the thin-film's thickness of the semiconductive material.

A further problem in the field of TF PV devices concerned with doping relates to preparing the surface, for example relates to increasing the overall surface, made available for doping.

Yet a further problem in the field of TF PV devices relates to damage to the CIGS that may be caused by post-CIGS deposition treatments.

A problem in the field of TF PV devices is the occurrence of carrier recombination which results in loss of PV conversion efficiency.

Another problem in the field of TF PV devices lies at the interfaces between the absorber layer, the optional buffer layer, and the front-contact layer: semiconductive junction points that desirably interface as point contacts with high conductivity to the front-contact layer must be well distributed across the layer's surface. The areal density of said point contacts must be tuned to the thin-films' semiconductive properties.

A further problem in the field of TF PV devices is that for some buffer layer compositions, the thicker the buffer layer, the lower its optical transmittance and therefore the lower the PV device's conversion efficiency.

Yet a further problem in the field of TF PV devices is that some buffer layer compositions, such as CdS, comprise the element cadmium, the quantity of which it is desirable to minimize.

Another problem in the field of TF PV device manufacturing is that the process for deposition of the buffer layer, such as chemical bath deposition (CBD), may generate waste. In the case of CdS buffer layer deposition the waste requires special treatment and it is therefore desirable to minimize its amount.

Yet another problem in the field of flexible TF PV device manufacturing is that it is desirable to benefit from large process windows for material deposition, and more specifically in relation to this invention, the process window for the adding of alkali metals and subsequent deposition of at least one buffer layer.

Finally, a problem in the field of TF PV devices is that of the color of the device. This problem may be even more important in the context of assemblies of PV devices, such as large PV modules, where multiple devices are placed next to each other and a desired match between the color of devices is desired. This may be for example to manufacture assemblies of PV devices of uniform color. It may also be to manufacture PV assemblies where different colors among PV devices are used to design patterns, writings, or gradients.

Briefly, the invention thus pertains to a method of fabricating TF PV devices comprising at least one $ABC_2$ chalcopyrite absorber layer, to adding at least one alkali metal, thereby forming alkali crystals embedded in the surface of the absorber layer, to selectively dissolving said alkali crystals, thereby leaving cavities at the surface of the absorber layer, and to treating the absorber layer surface. The resulting TF PV devices comprise at least one $ABC_2$ chalcopyrite absorber layer that may be characterized as having at its surface a large density of cavities of nanoscopic scale.

For the purposes of the present invention, the term "adding" or "added" refers to the process in which chemical elements, in the form of individual or compound chemical elements, namely alkali metals and their so-called precursors, are being provided in the steps for fabricating the layer stack of an optoelectronic device for any of:
- forming a solid deposit where at least some of the provided chemical elements will diffuse into at least one layer of said layer stack, or
- simultaneously providing chemical elements to other chemical elements being deposited, thereby forming a layer that incorporates at least some of the provided chemical elements and the other elements, or
- depositing chemical elements onto a layer or layer stack, thereby contributing via diffusion at least some of the provided chemical elements to said layer or layer stack.

In greater detail, the method for fabricating thin-film optoelectronic devices comprises providing a substrate, forming a back-contact layer, forming at least one absorber layer, which absorber layer is made of an ABC chalcogenide material, including ABC chalcogenide material ternary, quaternary, pentanary, or multinary variations, wherein A represents elements of group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te, adding at least one alkali metal, and forming at least one cavity at the surface of the absorber layer, wherein forming of said at least one cavity is by dissolving away from said surface of the absorber layer at least one crystal aggregate comprising at least one alkali crystal comprising at least one alkali metal.

In said method, the at least one alkali metal may comprise potassium. Furthermore, the method may comprise a step of aqueous wetting of at least the surface of the absorber layer with a diluted aqueous ammonia solution with a diluted ammonia molarity in the range from 0 to 20 M, preferably in the range from about 1 M to 10 M, more preferably in the range from about 2 M to 4 M. The method may comprise a step of treating the absorber layer surface by adding oxidation state +1/+2 elements to the surface of the absorber layer. At least one absorber layer may be $Cu(In,Ga)Se_2$. The method may also comprise forming at least one front-contact layer. Furthermore, the reflectance of the thin-film optoelectronic device may be adjusted by adjusting the amount of at least one alkali metal in the step of adding at least one alkali metal. The substrate may be delivered between a delivery roll and a take-up roll of a roll-to-roll manufacturing apparatus.

The invention also pertains to a TF optoelectronic device obtainable by the described method, comprising: a thin-film optoelectronic device obtainable by the aforementioned method, comprising: a substrate; a back-contact layer; at least one absorber layer, which absorber layer is made of an ABC chalcogenide material, including ABC chalcogenide material quaternary, pentanary, or multinary variations, wherein A represents elements of group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te; at least one alkali metal; and at least one cavity at the surface of the absorber layer; wherein the form of said at least one cavity is the result of dissolving away from said surface of the absorber layer at least one crystal aggregate comprising at least one alkali crystal comprising at least one alkali metal. In said device, the at least one alkali metal may comprise potassium. Also, the at least one alkali crystal may comprise a cubic crystal. Furthermore, the at least one alkali metal may comprise potassium and wherein a curve for counts of potassium in the device's sputter profiling graph comprises an upper peak of potassium within a depth ranging from the surface of the absorber layer to about 0.5 µm into the absorber layer. Said upper peak of potassium may comprise a base, the width of which is in the range from about 0.1 µm to 0.5 µm, preferably from about 0.15 µm to 0.3 µm, more preferably about 0.2 µm. Said upper peak of potassium may have a height that, measured from the number of counts above its base, is in the range from about 0.2 to 17 times, preferably from about 0.6 to 6 times, more preferably from about 1.1 to 2 times the number of counts from the point of minimum number of counts in potassium of the absorber layer to the number of counts at the base of said upper peak of potassium. Furthermore in the device, the at least one alkali metal may comprises potassium and the curve for the copper to selenium content in the device's energy dispersive X-ray line scan graph may comprise an extended region of low and about constant Cu/Se extending from the surface of the absorber layer into a portion of the depth of the absorber layer, said low and about constant region has a depth in the range from about 0.05 µm to 0.5 µm, preferably about 0.1 µm to 0.4 µm, more preferably about 0.2 µm to 0.3 µm. Also in the device, the at least one alkali metal may comprise potassium, comprise +1/+2 elements, and the X-ray photoelectron spectrometry curve may comprise a Cd 3d5/2 peak that is at least about 60% greater in height, preferably in the range of about 60% to 1000% greater in height, more preferably in the range of about 380% to 530% greater in height, than for the curve of a device wherein the at least one alkali metal does not comprise potassium. Furthermore, the surface of the absorber layer may comprises a plurality of cavities, said cavities covering a total relative projected area in the range from about 15% to 80%, preferably about 20% to 60%, more preferably about 25% to 45%. In greater detail, said cavities may have a mean cavity area in the range from about $0.1 \times 10^{-15}$ m$^2$ to about $0.8 \times 10^{-15}$ m$^2$, preferably from about $0.2 \times 10^{-15}$ m$^2$ to about $0.6 \times 10^{-15}$ m$^2$, more preferably from about $0.3 \times 10^{-15}$ m$^2$ to about $0.5 \times 10^{-15}$ m$^2$. At least one cavity may comprise cadmium. Said device may also comprise at least one front-contact layer.

Advantages

A main advantage of the invention is that it may enable, in a single manufacturing step with reduced and more efficient consumption of chemical products, the fabrication of a photovoltaic device with modified CIGS layer surface by contributing the features of surface nanostructuring, reduced surface damage, doping, buried and discrete semiconductive junction formation, and formation of point contacts. The resulting device may also feature reduced or no cadmium content.

Advantages of the invention derive from a method of adding substantial amounts of alkali elements to the absorber layer, selectively dissolving alkali crystals at the surface of the absorber layer, and adding oxidation state +1 and/or +2 elements to the absorber layer. High efficiency PV devices resulting from the method may be advantageous, thanks to a thinner or an absence of buffer layer, over prior art devices where little or no alkali elements have been added. The method may also be advantageous over prior art devices where no nanocavities have been formed. An advantageous effect of the invention is that the optimal thickness for an optional buffer layer coating said absorber layer may be thinner than the optimal buffer layer needed for prior art PV devices with comparable PV efficiency. The invention may shorten the manufacturing process, reduce environmental impact of manufacturing and of the resulting device, and increase device PV conversion efficiency.

The invention's features may advantageously solve several problems in the field of TF PV devices manufacturing, and more specifically manufacturing of the absorber and buffer layer of such devices. The listed advantages should not be considered as necessary for use of the invention. For manufacturing of TF flexible PV devices manufactured to the present invention, the advantages obtainable over devices and their manufacturing according to prior art include:

Higher PV conversion efficiency,
Improved absorber doping, especially towards the part of the layer that is closest to the front-contact layer,
Absorber layer nanostructuring that improves dopant effect and contributes to the formation of point contacts with the front-contact layer,
Improved semiconductor junction that helps reduce carrier recombinations,
Reduced semiconductor bulk defects that help reduce carrier recombinations,
Thinner or omitted buffer layer,
Shorter buffer layer deposition time,
Enlarged buffer layer deposition process window,
Enlarged deposition process window for alkali metal doping elements,
Increase in open-circuit voltage resulting from a decrease in recombination-relevant surface,
Enlarged tuning window for (in, Ga) addition to the CIGS absorber layer,
Improved copper to cadmium interface resulting in lower cadmium content in device,
Facilitated growth of stoichiometric absorber material,
More environmentally-friendly manufacturing process and devices,
Lower manufacturing costs,
Adjustment of PV device color and/or reflectance

BRIEF DESCRIPTION OF FIGURES

Embodiments of the invention will now be described by way of example, with reference to the accompanying drawings, in which.

DETAILED DESCRIPTION

In simplified terms, the following description details a TF PV device and especially the surface of its absorber layer which comprises a plurality of cavities formed by selectively dissolving away alkali crystals embedded in the absorber's surface. The cavities result from the dissolution of individual crystals and/or aggregates of crystals. The shape of the cavities, or nanocavities, corresponds to the geometry of the dissolved alkali crystals and their size may range from a few to over a hundred nanometers. Although the shape of the cavities more generally derives from cubic or aggregates of cubic crystals, the shape may also be rectangular, tetragonal, pyramidal, and possibly circular, or elliptic. The shape of cavities is a function of step temperatures and step durations used in the manufacturing method. The surface of the absorber layer is also doped. The description also details the method to manufacture the TF PV device, parameters to grow the alkali crystals that are embedded into the surface of the absorber layer, how to selectively dissolve said crystals without damaging the absorber layer, and how to dope the surface of the absorber layer within the overall manufacturing process. In effect, by forming cavities, the method may increase the total surface available to dope the surface of the absorber layer and at the same time reduce the volume within the absorber layer where detrimental carrier recombination may occur.

The invention is applicable to substrates that may or substrates that may not diffuse alkali elements into thin-film layers. For example the method is applicable to potassium-nondiffusing substrates. A "potassium-nondiffusing substrate" is a component, ordinarily a sheet of material, that comprises no potassium or so little potassium that diffusion of potassium elements into the subsequently described layers is considered too small to significantly alter the optoelectronic properties of the device. Potassium-nondiffusing substrates also include substrates that comprise means to prevent diffusion of potassium into coatings or layers supported by the substrate. A potassium-nondiffusing substrate may for example be a substrate that has been specially treated or coated with a barrier layer to prevent diffusion of potassium elements into coatings or layers supported by the substrate. Specially treated substrates or barrier-coated substrates ordinarily prevent the diffusion of a broad range of elements, including alkali metals, into coatings or layers supported by the substrate.

For clarity, components in figures showing embodiments are not drawn at the same scale.

Figure 1A:
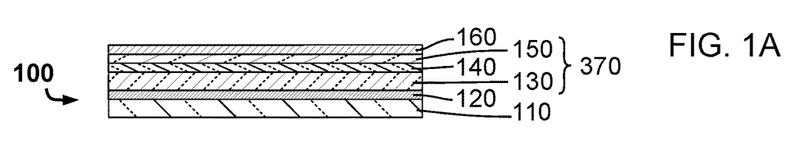
FIGS. 1A and 1B are cross-sections of an embodiment of a thin-film optoelectronic device.

FIG. 1A presents the cross-section of an embodiment of a TF optoelectronic or PV device 100 comprising a substrate 110 for a stack of material layers.

Substrate 110 may be rigid or flexible and be of a variety of materials or coated materials such as glass, coated metal, polymer-coated metal, polymer, coated polymer such as metal-coated polymer, or flexible glass. A preferred flexible substrate material is polyimide as it is very flexible, sustains temperatures required to manufacture high efficiency optoelectronic devices, requires less processing than metal substrates, and exhibits thermal expansion coefficients that are compatible with those of material layers deposited upon it. Industrially available polyimide substrates are ordinarily available in thicknesses ranging from 7 µm to 150 µm. Substrate 110 may be a potassium-nondiffusing substrate. Polyimide substrates are ordinarily considered as potassium-nondiffusing.

At least one electrically conductive layer 120 coats substrate 110. Said electrically conductive layer, or stack of electrically conductive layers, also known as the back-contact, may be of a variety of electrically conductive materials, preferably having a coefficient of thermal expansion (CTE) that is close both to that of the said substrate 110 onto which it is deposited and to that of other materials that are to be subsequently deposited upon it. Conductive layer 120 preferably has a high optical reflectance and is commonly made of Mo although several other TF materials such as metal chalcogenides, molybdenum chalcogenides, molybdenum selenides (such as $MoSe_2$), Na-doped Mo, K-doped Mo, Na- and K-doped Mo, transition metal chalcogenides, doped indium oxides, for example tin-doped indium oxide (ITO), non-doped indium oxides, doped or non-doped zinc oxides, zirconium nitrides, tin oxides, titanium nitrides, Ti, W, Ta, Au, Ag, Cu, and Nb may also be used or included advantageously.

At least one absorber layer 130 coats electrically conductive layer 120. Absorber layer 130 is made of an ABC material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS.

Optionally, at least one semiconductive buffer layer 140 coats absorber layer 130. Said buffer layer ordinarily has an energy bandgap higher than 1.5 eV and is for example made of CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

At least one transparent conductive layer 150 coats buffer layer 140. Said transparent conductive layer, also known as the front-contact, ordinarily comprises a transparent conductive oxide (TCO) layer, for example made of doped or non-doped variations of materials such as indium oxides, tin oxides, or zinc oxides.

Contributing to this invention, the amount of potassium comprised in the interval of layers 370 from electrically conductive back-contact layer 120, exclusive, to transparent conductive front-contact layer 150, inclusive, is in the range between 500 and 10000 potassium atoms per million atoms (ppm). A TF PV device demonstrating superior PV conversion efficiency preferably has an amount of potassium comprised in said interval of layers 370 in the range between 1000 and 2000 potassium atoms per million atoms. For a device comprising at least two alkali metals, one of which is potassium, the amount of said at least one alkali metal other than potassium may be in the range of 5 to 5000 ppm. the amount of at least one alkali metal other than potassium is at most ½ and at least 1/2000 of the comprised amount of potassium.

Optionally, front-contact metallized grid patterns 160 may cover part of transparent conductive layer 150 to advantageously augment front-contact conductivity. Also optionally, said TF PV device may be coated with at least one anti-reflective coating such as a thin material layer or an encapsulating film.

Figure 1B:
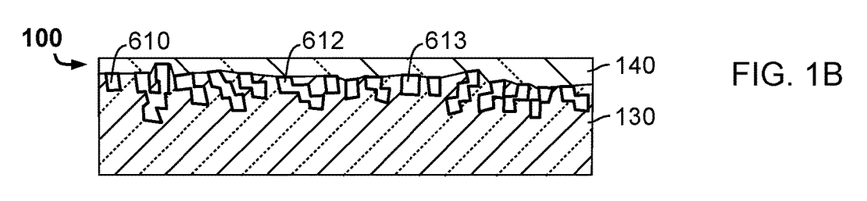

FIG. 1B presents a detail of a cross-section of an embodiment of a TF optoelectronic or PV device 100. FIG. 1B shows part of absorber layer 130 and part of optional buffer layer 140. The place of buffer layer 140 may be replaced by other types of transparent layers, for example a transparent conductive layer 150. FIG. 1B also shows, near and/or at the surface of absorber layer 130, a plurality of cavities 610, 612, 613. Said cavities result from selectively dissolving alkali crystals or aggregates of alkali crystals embedded within the surface of the absorber layer without dissolving the $ABC_2$ material of the absorber layer. The shape of said cavities in the cross-section ordinarily resemble squares, rectangles, and aggregates of squares and rectangles. The shape of said cavities may also resemble crystals subject to crystal twinning. FIG. 1B illustrates sixteen of said cavities 610, 612, 613. The surface of absorber layer 130 also comprises at least one oxidation state +1 element and/or at least one oxidation state +2 element (see description for FIG. 2). On the cross-section of the TF device, the surface of the absorber layer 130 is defined as the region in which the cavities 610, 612, 613 extend into the absorber layer and additionally up to about 80 nm, preferably 50 nm, into the absorber layer 130. Consequently, absorber layer 130 is mostly a p-type absorber but, at its surface in contact with at least one of buffer layer 140 or front-contact layer 150, comprises n-type absorber material. Absorber layer 130 may therefore comprise at least one homojunction, preferably a plurality of homojunctions. Said homojunctions may be located at said cavities, preferably within the absorber layer material surrounding said cavities comprised in a radius of about 100 nm. An example of homojunction for an $ABC_2$ absorber layer is a p-type CIGS absorber layer comprising n-type CIGS at the surface. Furthermore, the surface of the absorber layer may also comprise at least one heterojunction, preferably a plurality of heterojunctions. Said heterojunction may for example comprise a p-type CIGS absorber layer combined with n-type material such as CdS, Cd(S, OH), Cd(O,H), CdZnS, $KInSe_2$, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

Figure 2:
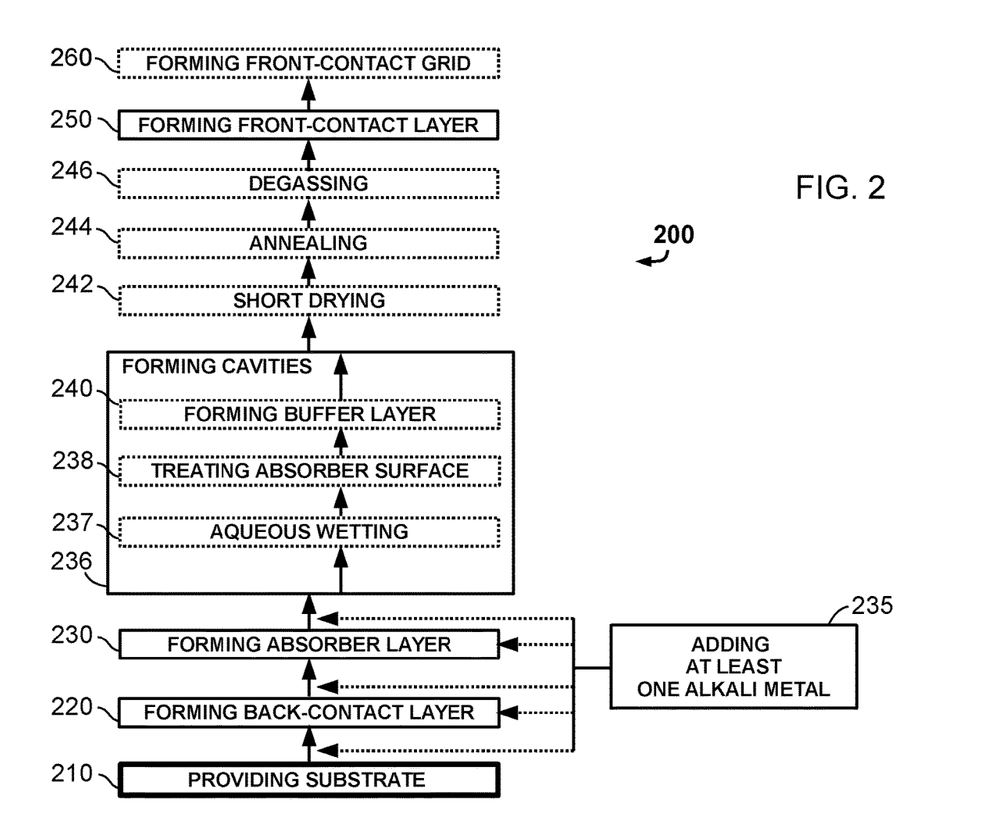
FIG. 2 presents steps in a method to manufacture a thin-film optoelectronic device.

FIG. 2 presents a method 200 comprising material deposition steps to manufacture said TF optoelectronic or PV device 100 comprising a stack of material layers where at least one alkali metal, one of them comprising potassium, has been added. The method is considered to be especially appropriate for substrates considered potassium-nondiffusing or that may comprise at least one barrier layer that prevents the diffusion of alkali metals from the substrate into subsequently deposited coatings. The method as described is applicable to production on glass, metal, or various coated substrates, and is especially advantageous for polymer substrate materials such as polyimide.

An exemplary sequence of material layer deposition and treatment follows. The purpose of this description is to clarify the context within which treatment after deposition of the absorber layer, the main subject of this invention, occurs. Between any of the subsequent manufacturing steps, a person skilled in the art will know how to, as an option, temporarily store the unfinished product, for example within a vacuum or near vacuum container or even within a container characterized by a controlled atmospheric environment or possibly a container comprising at least one inert gas. Exposure to air and/or to humidity is known to have an effect on the chemical composition of the material layers deposited during the material deposition steps. A person skilled in the art will advantageously use steps of the method within a manufacturing sequence where exposure to air and/or humidity is kept to a minimum between steps. A person skilled in the art may also use steps of the method so that the intermediate product is only exposed to a controlled environment between steps, such as vacuum, near vacuum, low humidity atmosphere, or at least one inert gas. In case of exposure to air between steps that is different from air at standard ambient temperature and pressure (SATP) and 40% relative humidity (RH), a person skilled in the art will adapt the limits for said cumulated minutes in air according to changes in aforementioned environmental parameters. In the rest of this document, the word minutes is abbreviated as min.

The method starts at step 210 by providing a substrate. Said substrate may be a potassium-nondiffusing substrate.

Following step 210 and prior to the step of forming cavities 236, adding of at least one alkali metal 235 occurs as at least one event during and/or between any of steps comprised in the interval from step of providing substrate 210 (excluding the step 210 itself), to the step of forming cavities 236 (excluding the step 236 itself). Said at least one of said alkali metal preferably comprises potassium. The fact that the adding may occur during or between said interval of steps is represented by dashed arrows emanating from block 235 in FIG. 2. Each of said alkali metals may be added simultaneously with any of the other of said alkali metals and/or during separate adding events. Adding of each of said alkali metals may comprise any or a combination of adding a layer or precursor layer of at least one of the alkali metals, co-adding at least one of the alkali metals with the forming of any of the method's material layers, or diffusing at least one of the alkali metals from at least one layer into at least one other material layer. Preferably, adding of at least one different alkali metal is done in the presence of at least one said C element. More preferably, adding of potassium, for example by adding via a so-called potassium-comprising precursor such as KF, KCl, KBr, KI, $K_2S$, $K_2Se$, is done in the presence of at least one said C element.

At step 220, forming at least one back-contact layer comprises depositing at least one electrically conductive layer. Forming of the back-contact layer may be done using a process such as sputtering, spraying, sintering, electrodeposition, CVD, PVD, electron beam evaporation, or spraying of the materials listed in the description of said electrically conductive layer 120.

At step 230, forming at least one absorber layer comprises coating said electrically conductive layer with at least one ABC absorber layer 130. The materials used correspond to those in the description provided for ABC absorber layer 130. Said absorber layer may be deposited using a variety of techniques such as sputtering, spraying, sintering, CVD, electrodeposition, printing, or as a preferred technique for an ABC material, physical vapor deposition. Substrate temperatures during absorber layer deposition are ordinarily comprised between 100° C. and 650° C. The range of temperatures and temperature change profiles depend on several parameters including at least the substrate's material properties, the supply rates of the materials that compose the ABC material, and the type of coating process. For example, for a vapor deposition process, substrate temperatures during forming of the absorber layer will ordinarily be below 600° C., and if using substrates requiring lower temperatures, such as a polyimide substrate, preferably below 500° C., and more preferably in the range from 100° C. to 500° C. For a co-evaporation vapor deposition process, substrate temperatures during forming of the absorber layer will ordinarily be in the range from 100° C. to 500° C. Said substrate temperatures may be advantageously used with a polyimide substrate.

For a deposition process such as physical vapor deposition, for example if forming absorber layer 230 is done using a physical vapor deposition process, adding of potassium as part of adding at least one alkali metal 235 may be done during and/or in continuation of the physical vapor deposition process by supplying potassium fluoride, KF. This may, for example, be advantageous when manufacturing with a co-evaporation physical vapor deposition system. Adding the alkali metal potassium will preferably be done in the presence of a flux of element Se supplied at a rate in the range of 5 to 100 Å/s, preferably at a rate in the range of 20 to 50 Å/s.

Substrate temperature ranges for said adding of at least one alkali metal are from 100° C. to 700° C., preferably from 250° C. to 450° C., more preferably from 330° C. to 370° C. A person skilled in the art will select appropriate temperatures for said adding of at least one alkali metal so that they are compatible with the materials deposited, TF properties, and substrate. For example, one skilled in the art of physical vapor deposition processes will know that potassium, for example in the form of KF, may be added at higher temperatures than some other alkali metals such as sodium, for example in the form of NaF. The possibility of higher adding temperature for KF may advantageously be used to add alkali metals starting with potassium at temperatures closer to those used at step 230 and, as the substrate temperature decreases, to continue with adding of same and/or other alkali metals. For example, adding of at least one alkali metal may be with a physical vapor deposition process where alkali metal potassium, for example in the form of a KF potassium-comprising precursor, is supplied at a rate equivalent to an effective layer deposition of about 1 nm/min to 2 nm/min for a duration of 20 minutes. For another example, adding of at least one alkali metal preferably uses a physical vapor deposition process where sodium, for example in the form of NaF sodium-comprising precursor, is first added at a rate of about 1 nm/min to 2 nm/min for a duration of 20 minutes and followed, possibly as part of a co-evaporation process, by adding of potassium, for example in the form of a KF potassium-comprising precursor, at a rate of about 1 nm/min to 2 nm/min for a duration of 20 minutes. A person skilled in the art may adapt deposition rate and duration. The skilled person will also know that adding of at least one alkali metal may take place with adding of one or more of said at least one alkali metal at substrate temperatures ordinarily lower than 700° C. and possibly much lower than 350° C., such as at ambient temperatures of about 25° C. and below. The substrate may then be heated afterwards, thereby facilitating diffusing of said alkali metals to the TF layers of the optoelectronic device, possibly in combination with depositing at least one C element. Adding at least one alkali metal 235 is preferably done in the presence of Se.

The amount of potassium added by adding at least one alkali metal 235 is such that following forming of front-contact layer 150 at later step 250, said amount comprised in the interval of layers 370 from back-contact layer 120, exclusive, to front-contact layer 150, inclusive, is in the range between 500 and 10000 potassium atoms per million atoms and the amount of the other of said at least one alkali metal is in the range of 5 to 5000 ppm and at most ½ and at least 1/2000 of the comprised amount of potassium. A TF PV device that has a superior PV conversion efficiency preferably has an amount comprised in said interval of layers 370 from about 1000 to 2000 potassium atoms per million atoms.

Also, adding some of at least one alkali metal preferably occurs after forming the last of at least one absorber layer 230 and before at least one of step of forming cavities 236. The latter adding some of at least one alkali metal preferably comprises an alkali compound that comprises potassium. Said alkali compound may comprise any of an alkali metal, an alkali halide, or an alkali salt.

At step 236, that of forming cavities, at least the surface of absorber layer 130 is subject to at least one of the steps of aqueous wetting 237, treating absorber surface 238, and forming buffer layer 240. At step 236 at least one, preferably a plurality, of alkali crystals embedded within the surface of the absorber layer is dissolved. Part of the absorber layer material directly underlying at least one of said alkali crystal may also be dissolved, said part will ordinarily not extend deeper into the absorber than one height unit corresponding to the depth of the crystal embedded into the absorber layer. Also, part of the surface of the absorber layer directly in contact with said alkali crystals may be dissolved. Furthermore, part of the surface of the absorber layer may also be dissolved.

At optional step 237, represented as a dashed box because the step may be considered optional, aqueous wetting comprises wetting at least the surface of absorber layer 130 with at least one aqueous wetting. Aqueous wetting will preferably be done in a bath. Aqueous wetting may also be done using spraying. Aqueous wetting is preferably with a diluted aqueous ammonia solution. Exposure to air is known to have an effect on the chemical composition of the absorber layer. A person skilled in the art will try to minimize the duration of exposure of the device to air. Although the duration of exposure may be of several days, aqueous wetting preferably occurs after the substrate has spent a duration of at most 10, more preferably less than 5, cumulated minutes in air at SATP and 40% RH after completion of the forming absorber layer step 230. Described briefly, composition of the preferred diluted aqueous ammonia solution bath is an aqueous solution with a molarity in the range from 3 M to 5 M. Said diluted aqueous ammonia solution comprises a mixture of water and commercially available ammonia aqueous solution. Parameters relevant to the aqueous wetting step comprising a bath comprise a cumulated duration of about 10 min, preferably, about 2 min, a bath temperature of about 25° C. and a molarity of about 3 mol/L (also written M). Ranges, preferred ranges, and most preferred ranges for said parameters are presented in Table 1. Most preferred ranges are at least applicable using a bath. A person skilled in the art will readily adapt parameters to other types of wetting apparatuses.

Wetting steps may take place in a chemical bath deposition (CBD) apparatus and/or a spraying apparatus. A chemical bath deposition system ensures continuous flow and mixing of the bathing solution over at least absorber layer 130.

At steps treating absorber surface 238 and/or forming buffer layer 240, so-called "oxidation state +1" and/or so-called "oxidation state +2" elements, thereafter abbreviated +1/+2 elements, are added to the absorber layer 130 and especially to the surface of the absorber layer. Adding of oxidation state +1/+2 elements to the surface of the absorber layer transforms at least at portion of the surface from a p-type absorber surface into an n-type absorber surface, thereby forming a buried junction at least a portion of the absorber layer. Said buried junction may be a homojunction. Said buried junction is preferably a p-n junction. Resulting presence of oxidation state +1/+2 elements into the absorber layer may then, for example, be the result of physisorption, chemisorption, or diffusion. Said oxidation state +1/+2 elements comprise at least one element of at least one of group 2, group 3, lanthanide series, actinide series, or transition metals from the periodic table of elements. A commonly used oxidation state +1/+2 element is cadmium. Although this description focuses mostly on solutions comprising cadmium, a person skilled in the art may adapt the invention to use steps that comprise other or additional oxidation state +1/+2 elements. For example, a person skilled in the art may want to reduce or eliminate the amount of cadmium comprised in the resulting PV device by replacing part or all of the cadmium used in the method with at least one other oxidation state +1/+2 element.

At step 238, represented as a dashed box because the step may be considered optional, at least absorber layer 130 is subject to at least one treating absorber surface 238. The step of treating absorber layer 238 is especially useful if the step of forming buffer layer 240 is omitted. The duration of exposure to air between aqueous wetting 237 and treating absorber surface 238 is preferably at most 2, preferably less than 0.5, cumulated minutes in air at aforementioned SATP and RH of step 237. Described briefly, relevant parameters for treating absorber surface comprise treating for a cumulated duration of about 22 minutes at least absorber layer 130 into a solution with temperature of about 70° C. comprising, per liter of water, an amount of about 60 mL of cadmium (Cd) solution and an amount of about 140 mL of ammonia ($NH_3$) solution. Ranges for said parameters are presented in Table 1. Said water is preferably distilled water or deionized water, more preferably ultra-pure water with a resistivity of about 18 MΩ·cm. Said cadmium solution comprises a Cd salt solution with a molarity most preferably in the range from about 0.026 to 0.03 mol/L. Concentration of said ammonia solution is more preferably in the range from 14.3 to 14.7 M. Ranges, preferred ranges, and most preferred ranges for said parameters are presented in Table 1. Most preferred ranges are at least applicable using a bathing apparatus.

At optional step 240, represented as a dashed box because the step may be considered optional, forming buffer layer comprises coating said absorber layer with at least one so-called semiconductive buffer layer 140. The materials used correspond to those in the description provided for buffer layer 140. Said buffer layer may be deposited using a variety of techniques such as CVD, PVD, sputtering, sintering, electrodeposition, printing, atomic layer deposition, or as a well known technique at atmospheric pressure, chemical bath deposition (CBD). To form a cadmium sulfide buffer layer, a person skilled in the art may form at least one buffer layer bath for CBD comprising a Cd salt aqueous solution of about 0.028 M concentration and an ammonia solution of about 14.5 M concentration that are first mixed together with water, preferably high-purity water (18 MΩ·cm), in a volume ratio of about 3:7:37, preheated to about 70° C. for about 2 min, and then supplemented with a thiourea aqueous solution of about 0.374 M concentration. At least absorber layer 130 is then immersed within said buffer layer bath that is maintained to a temperature of about 70° C. until the desired buffer layer thickness is obtained. At least absorber layer 130 is then washed with water, preferably high-purity water.

Following at least one step of forming cavities 236, a person skilled in the art will notice, for example using TF analysis techniques such as X-ray photoelectron spectrometry (XPS) or secondary ion mass spectrometry (SIMS), that the surface of the absorber layer comprises more oxidation state +1/+2 elements than the surface of absorber layers manufactured according to prior art or, for an analysis using inductively coupled plasma mass spectrometry (ICP-MS), that the concentration of the +1/+2 elements in the absorber layer is higher than in absorber layers manufactured according to prior art.

TABLE 1

| Ranges for steps 237 to 246. | | | |
|---|---|---|---|
| | Range from-to | Pref. range from-to | More pref. range from-to |
| Step 237: Aqueous wetting | | | |
| Duration [min] | 0.05-7200 | 0.1-30 | 1-5 |
| Temperature [° C.] | 2-95 | 10-50 | 23-27 |
| Diluted ammonia molarity [mol/L] | 0-20 | 1-10 | 2-4 |
| Step 238: Treating absorber surface | | | |
| Duration [min] | 0.05-7200 | 0.1-30 | 20-24 |
| Temperature [° C.] | 2-95 | 10-85 | 65-75 |
| Amount of Cd solution per liter [mL] | 10-1000 | 20-100 | 55-65 |
| Amount of $NH_3$ solution per liter [mL] | 0-990 | 20-400 | 130-150 |
| Cd molarity in Cd solution [mol/L] | 0.00001-10 | 0.01-0.1 | 0.026-0.03 |
| Ammonia solution molarity [mol/L] | 1-30 | 10-20 | 14.3-14.7 |
| Step 240: Forming buffer layer | | | |
| Duration [min] | 0.05-7200 | 0.1-30 | 14-18 |
| Temperature [° C.] | 2-95 | 10-85 | 65-75 |
| Cd salt solution molarity [mol/L] | 0.00001-10 | 0.01-0.1 | 0.026-0.030 |
| Ammonia solution molarity [mol/L] | 1-30 | 10-20 | 14.3-14.7 |
| Thiourea aq. sol. molarity [mol/L] | .01-10 | 0.2-0.6 | 0.35-0.4 |
| Step 244: Annealing | | | |
| Cadmium sulfide, temperature [° C.] | 100-300 | 150-200 | 175-185 |
| Cadmium sulfide, duration [min] | 1-30 | 1-5 | 1.8-2.2 |
| Zinc oxi-sulfide, temperature [° C.] | 100-300 | 150-250 | 190-210 |
| Zinc oxi-sulfide, duration [min] | 1-30 | 5-15 | 9-11 |
| Step 246: Degassing | | | |
| Degassing temperature [° C.] | 10-150 | 20-60 | 28-32 |
| Degassing duration [min] | 0.1-3000 | 1440-2880 | 1800-2400 |

For example, for devices where the oxidation state +1/+2 element(s) added at the step of forming cavities 236 is cadmium, an ICP-MS analysis of the resulting device after forming cavities is summarized in Table 2. Here, adding at least one alkali metal 235 is provided by evaporating material comprising potassium fluoride (KF) to add potassium to the absorber layer 130. Three devices are compared: a first device where no potassium is added, a second, best mode device, subjected to about 20 minutes of evaporation, and a third device subjected to about 60 minutes of evaporation. The evaporation rates are those mentioned previously. Evaporations flux rates and corresponding evaporation durations will be adapted by the person skilled in the art. A person skilled in the art may therefore advantageously use a manufacturing method where adjusting the amount of adding at least one alkali metal 235, or for a more specific example, adding potassium, contributes to regulating the amount of oxidation state +1/+2 elements that are added to or absorbed by the absorber layer. Said method of adding at least one alkali metal 235 may also contribute to adjusting the duration of the step of forming cavities 236 or steps therein 237, 238, 240.

TABLE 2

Effect on cadmium concentration from post-deposition adding of potassium

| | Cadmium concentration (atomic percentage) | | |
|---|---|---|---|
| | Range from-to | Pref. range from-to | Most pref. range from-to |
| Device with no added potassium | 0.02-0.15 | 0.05-0.1 | 0.07-0.08 |
| Dev. with 20 min. added potassium | 0.05-1 | 0.1-0.4 | 0.2-0.3 |
| Dev. with 60 min. added potassium | 0.1-2 | 0.2-0.8 | 0.4-0.5 |

Steps 238 and/or 240 are preferably done in at least one bathing apparatus. However, a person skilled in the art will readily adapt the method for use with a spraying apparatus. It is also possible to use physical vapor deposition (PVD) apparatuses and a plurality of associated deposition methods, the most common being evaporative deposition or sputter deposition. A person skilled in the art will readily manufacture a set of devices covering a range of parameters, for example a range of durations for at least one of steps 237, 238, 240, 244, 246, so as to obtain a photovoltaic device where, for example, photovoltaic efficiency is maximized. Other objectives may be, for example, to minimize buffer layer thickness, maximize efficiency to buffer layer thickness ratio, or maximize efficiency to cadmium content ratio.

At optional step 242 at least absorber layer 130 is subject to at least one short drying step. The short drying step may be done in air, preferably using a blown inert gas, more preferably using at least one ionization blow off nozzle, even more preferably with the blown inert gas being nitrogen.

At optional step 244 at least absorber layer 130 is subject to at least one annealing step. For a cadmium sulfide buffer layer, said annealing step is preferably done at about 180° C., preferably in air for about 2 min. For a zinc oxi-sulfide buffer layer, said annealing step is preferably done at about 200° C., preferably in air for about 10 min.

At optional step 246, at least absorber layer 130 is subject to at least one degassing step. This step is ordinarily not needed for devices where the substrate does not absorb humidity, for example glass or metal substrates. Said degassing is preferably done in vacuum. The degassing step is preferred for substrate materials, for example polyimide, that may have absorbed humidity at previous manufacturing steps. For example, for a degassing temperature of about 25° C., an effective degassing duration is about 35 hours.

Parameter ranges for steps 237 to 246 are provided in Table 1. To tune the optional process of forming the buffer layer of step 240, one skilled in the art will ordinarily develop a test suite over a range of buffer coating process durations to manufacture a range of PV devices comprising a range of buffer layer thicknesses. One will then select the buffer coating process duration that results in highest PV device efficiency.

The following steps describe how to complete the manufacture of a working PV device benefiting of the invention.

At step 250, forming front-contact layer comprises coating said buffer layer with at least one transparent conductive front-contact layer 150. Said front-contact layer ordinarily comprises a transparent conductive oxide (TCO) layer, for example made of doped or non-doped variations of materials such as indium oxide, gallium oxide, tin oxide, or zinc oxide that may be coated using a variety of techniques such as PVD, CVD, sputtering, spraying, CBD, electrodeposition, or atomic layer deposition.

At optional step 260, forming front-contact grid comprises depositing front-contact metallized grid traces 160 onto part of transparent conductive layer 150. Also optionally, said TF PV device may be coated with at least one anti-reflective coating such as a thin material layer or an encapsulating film.

The steps may also comprise operations to delineate cell or module components. Delineation ordinarily comprises cutting grooves into back-contact layer 120 to provide electrically separate back-contact components. A second delineation step comprises cutting grooves, segments, or holes into at least absorber layer 130. The second delineation step may also comprise cutting into at least one of front-contact layer 150, buffer layer 140, or back-contact layer 120. A third delineation step comprises cutting grooves into at least front-contact layer 150. The second and third delineation step may be made simultaneously. Delineation, also called patterning, is preferably done using at least one laser.

Figure 3A:
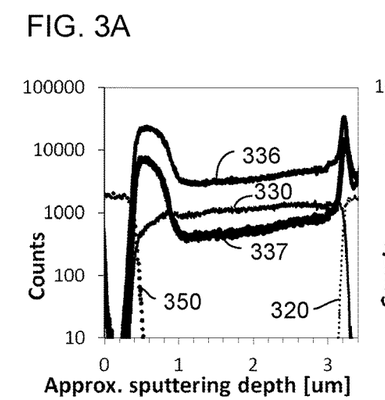
FIGS. 3A-3B are sputter depth profiling graphs obtained using second ion mass spectrometry (SIMS).
Figure 3B:
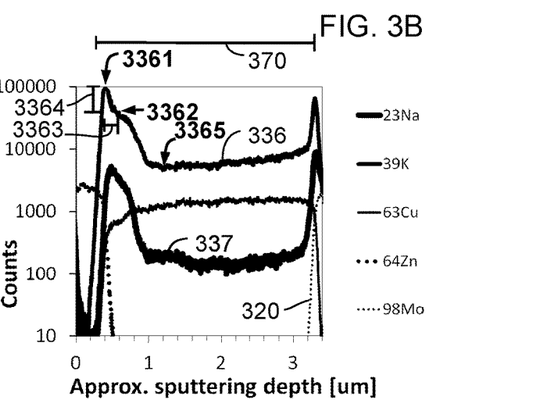

FIGS. 3A-3B are sputter depth profiling graphs plotting the counts of various elements within the optoelectronic device versus approximate sputter depth. FIG. 3A is for a device manufactured according to the invention and FIG. 3B is for a device manufactured according to one method corresponding to the best mode of carrying out the invention. FIGS. 3A-3B would require a calibration, for example based on copper content, to be directly compared. FIG. 3A corresponds to a PV device subjected to a supply comprising about 4 to 6 times more sodium than potassium, namely 20 min of sodium fluoride and 5 min of potassium fluoride. Sodium and potassium may be supplied in successive, in synchronous, or in reverse steps. A person skilled in the art will know that the amount of alkali elements supplied does not correspond to the amount of alkali elements that remain in the absorber layer upon manufacturing completion. Furthermore, supply of alkali elements may contribute to the removal of alkali elements that may already be present within the absorber layer. FIG. 3B corresponds to a laboratory-manufactured PV device subjected to a supply comprising about as much sodium as potassium, namely 20 min cumulated evaporation of sodium fluoride and 20 min cumulated evaporation of potassium fluoride. Durations are cumulated evaporation durations. For a device that is manufactured industrially according to the invention, the person skilled in the art may use other, preferably shorter, cumulated evaporation durations to obtain best mode devices. An at least one alkali metal, potassium 336, is plotted with one more alkali metal, sodium 337. Of special interest to characterize a device manufactured according to the invention's best mode, independently of aforementioned manufacturing durations, is the upper peak of potassium counts 3361 occurring at the surface of the absorber layer. As shown in FIG. 3A, said upper peak of potassium counts 3361 is ordinarily not present in devices that are not manufactured according to the best mode of carrying out the invention. Numerical analysis on various graphs may be done on locally weighted scatterplot smoothing (LOESS)-smoothed data (for example with smoothing parameter α=0.7). On the graph for potassium 336, starting from the peak of potassium counts and progressing into the absorber layer one reaches an inflection point marking the base 3362 of the upper peak of potassium. The width 3363 of the base 3362 of said upper peak of potassium 3361 is in the range from about 0.1 μm to 0.5 μm, preferably from about 0.15 μm to 0.3 μm, more preferably about 0.2 μm. Said width may be interpreted as a depth into the absorber layer 130. The height 3364 of said upper peak of potassium 3361, measured from the number of counts above its base 3362, is in the range from about 0.2 to 17 times, preferably from about 0.6 to 6 times, more preferably from about 1.1 to 2 times the number of counts from the point of minimum number of counts in potassium 3365 of the absorber layer to the number of counts at the base 3362 of said upper peak of potassium 3361. The graphs also present data for copper 330, representative of the absorber layer, of zinc 350, representative of the front-contact layer, and of molybdenum 320, representative of the back-contact layer. Also of guidance for manufacturing of a successful device is the ratio of potassium to sodium at a given point along the depth into the absorber layer. The ratio of counts for the peak of potassium to that of the peak of sodium is in the range from about 10 to 80, preferably about 12 to 50, more preferably about 16 to 20. The ratio of counts for the depth of lowest count of potassium to that of sodium at same depth is in the range from about 8 to 80, preferably about 10 to 50, more preferably about 18 to 22. The graphs show that, very approximately, at a given depth, the counts of potassium are about an order of magnitude greater than the counts of sodium. At a given depth, counts of sodium in FIG. 3B are also about half an order of magnitude lower than in FIG. 3A, even though a similar cumulated evaporation of sodium fluoride is used. Device photovoltaic conversion efficiencies are 17.8% for FIG. 3A and 18.9% for FIG. 3B. Interval of layers 370 from back-contact layer 120, exclusive, to front-contact layer 150, inclusive, is measured from the log-scale plot's half-height of shallowest maximum of back-contact layer to half-height of shallowest maximum of front-contact layer, respectively. The sputter depth profiling graph was obtained using second ion mass spectrometry (SIMS). Depth profiling data were obtained with a SIMS system using $O_2^+$ primary ions with 2 kV ion energy, 400 nA, and 300×300 μm² spot. The analyzed area was 100×100 μm² using $Bi_1^+$ with 25 kV ion energy.

Figure 3C:
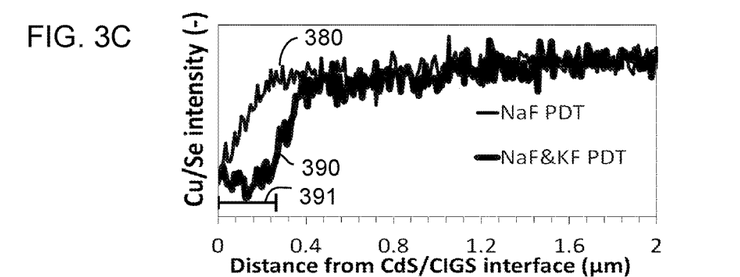
FIG. 3C compares the Cu/Se compositional profile of absorber cross-sections measured by energy-dispersive X-ray spectroscopy (EDX) in a transmission electron microscope (TEM).
Figure 4A:
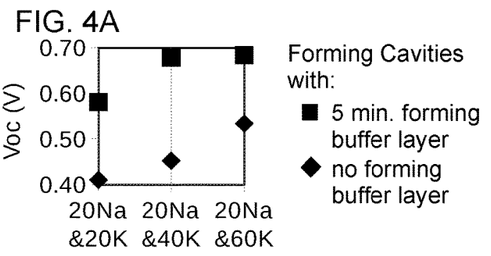
FIGS. 4A-4D are graphs enabling comparison of process parameters for forming CIGS surface cavities.
Figure 4B:
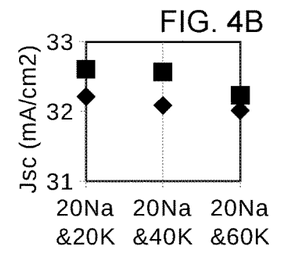
Figure 4C:
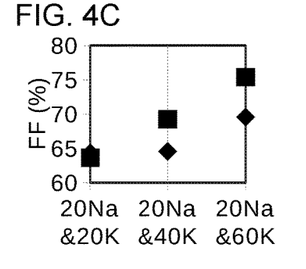
Figure 4D:
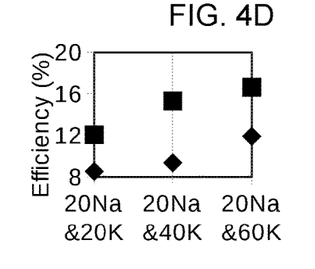

FIG. 3C is an energy dispersive X-ray (EDX) line scan graph acquired in a transmission electron microscope enabling a comparison of copper to selenium content (Cu/Se) into the thickness of the absorber layer 130 for two photovoltaic devices. Using Cu/Se data enables comparison between devices, using selenium content as a normalizing baseline. The distance from the surface of the device after the step of forming cavities should here only be considered as relative and indicative. A person skilled in the art of EDX measurements will know that the device's tilt angle within the microscope will influence the graph's scale. The plot for a first device 380 is representative of a device where, prior to the step of forming cavities 236, the alkali crystals embedded in the surface of the absorber layer do not comprise potassium. Said first device is then subject to the step of forming cavities 236 and the copper content measured by EDX line scan to produce said plot. The plot for the second device 390 is representative of a device where, prior to the step of forming cavities 236, the alkali crystals embedded in the surface of the absorber layer comprise potassium. More specifically, the plot for the second device 390 is for a device comprising sodium and potassium. Said second device is then subject to the step of forming cavities 236 and the copper content measured by EDX line scan to produce the plot for the second device 390. The second device corresponds to the best mode for carrying the invention. The EDX plot for the second device comprises an extended region of low and about constant Cu/Se 391 extending from the surface of the absorber layer into a portion of the depth of the absorber layer. Said low and about constant region 391 has a depth in the range from about 0.05 μm to 0.5 μm, preferably 0.1 μm to 0.4 μm, more preferably 0.2 μm to 0.3 μm. It is ordinarily in this region that some copper is replaced by, for example, cadmium and/or oxidation state +1/+2 elements. The extended region 391 is said low because at depths greater than said region into the absorber layer, the value of Cu/Se rises and then remains at a constant value at further depth into the absorber layer.

FIGS. 4A to 4D present data obtained for a device where the step of forming cavities 236 comprises, for a first dataset, the steps of aqueous wetting 237 and treating absorber surface 238, and for a second dataset, additionally comprises forming buffer layer 240. FIGS. 4A to 4D are graphs illustrating the effect of adding an alkali metal comprising potassium and the effect of forming a buffer layer comprising cadmium-sulfide on PV parameters. FIGS. 4A to 4D are drafted, for illustrative purposes representative of prior art, with a baseline method where an alkali metal comprising sodium is also added. The figures show that the greater the amount of potassium, the greater the open circuit voltage $V_{OC}$, the greater the fill factor, and the greater the PV efficiency. The figures also show that a step of forming a buffer layer contributes to a greater open circuit voltage, a greater short circuit current, a greater fill factor, and a greater PV efficiency. A step of forming a cadmium sulfide buffer layer based on a CBD process that lasts about 5 minutes enables an increase in PV efficiency in a range from about 3% to 7%. Said step of forming buffer layer is with a temperature of about 70° C. FIGS. 4A to 4D present data for a laboratory process with similar supply rates for sodium and potassium evaporation sources. The baseline evaporation duration is 20 min for sodium and a set of tests where potassium evaporation durations are 20, 40, and 60 min. A person skilled in the art will readily reduce said durations for an industrial manufacturing system where supply rates will be greater, possibly different for different sources of alkali metals, and enable shorter durations. Furthermore, the ratio of alkali metal supplies will advantageously be adjusted for the different alkali metals. FIGS. 4A to 4D illustrate potassium over sodium alkali metal supply ratios ranging from about 1 to 3 but said ratios will preferably be in the range from 2 to 20, more preferably 2 to 10. For example, a PV device manufactured with a potassium to sodium ratio of 3 with no step for forming buffer layer results in a PV efficiency of about 12% with a $V_{OC}$ of about 0.54 V. A similar device manufactured with a step of forming buffer layer 240 results in a PV efficiency of about 16.7% with a $V_{OC}$ of about 0.68 V.

FIGS. 5A-5E are graphs derived from X-ray photoelectron spectrometry (XPS) enabling comparison of the effect of adding at least one alkali metal 235 on the chemical composition of the absorber layer surface. Measurements are obtained after the step of forming cavities 236. Measurements of XPS intensity (in arbitrary units) as a function of binding energy (in eV) for 3 types of devices are presented: devices where the step of adding at least one alkali metal 235 is not performed (abbreviated Alk0), devices where said step only comprises sodium alkali metals (abbreviated AlkNa), and devices where said step comprises sodium and potassium alkali metals (abbreviated AlkNaK). Following the step of forming absorber layer 230 and, where applicable, the step of adding at least one alkali metal 235, the device was subject to the step of forming cavities 236 comprising the step of treating absorber surface 238. Although results presented in FIGS. 5A to 5E are for devices manufactured according to a step of treating absorber surface 238 lasting 22 min at SATP, a person skilled in the art will notice a $Cd3d_{5/2}$ peak that is substantially higher for that of AlkNaK than that of Alk0 or AlkNa.

Figure 5A:
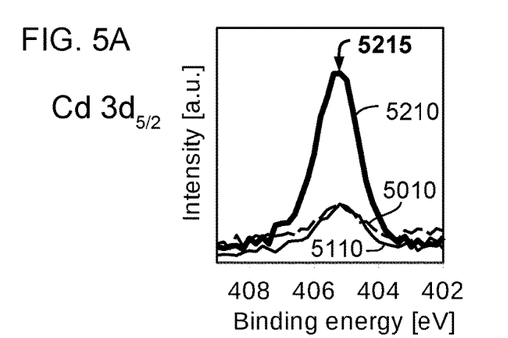
FIGS. 5A-5E are graphs derived from X-ray photoelectron spectrometry (XPS) enabling comparison of the effect of adding at least one alkali metal on the chemical composition of the absorber layer surface.

FIG. 5A presents XPS data in a range from about 408 eV to 402 eV for Alk0 5010, AlkNa 5110, and AlkNaK 5210. Each curve presents a peak at about 405.1 eV corresponding to the binding energy spectra of cadmium $Cd3d_{5/2}$. The graph for AlkNaK presents a $Cd3d_{5/2}$ peak 5215 that, based on the 405.1 eV point on a line extending from points of 408 eV to 402 eV, is at least 60% greater in height, preferably in the range of 60% to 1000% greater, more preferably in the range of 380% to 530% greater, for the $Cd3d_{5/2}$ peak of AlkNaK than for that of Alk0 or AlkNa. This suggests that the surface of the absorber layer may comprise at least one region of increased inversion doping for AlkNaK compared to Alk0 or AlkNa. Said at least one region therefore comprises a higher amount of $Cd_{Cu}$, i.e. sites where cadmium has replaced copper. The surface of the absorber layer comprises at least one region of cadmium-doped ABC material, or in this case $ABC_2$ material, specifically in this example, CIGS material. Said regions of cadmium-doped ABC material comprise at least one cavity, preferably a plurality of cavities, the surrounding of which, comprised in a radius of about 100 nm, preferably 50 nm, more preferably 20 nm, comprises cadmium-doped ABC material.

Figure 5B:
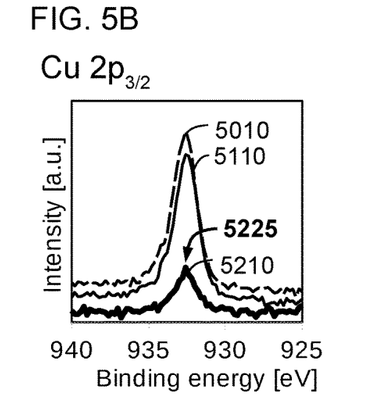

FIG. 5B presents XPS data in a range from about 940 eV to 925 eV for Alk0 5010, AlkNa 5110, and AlkNaK 5210. Each curve presents a peak at about 933 eV corresponding to the binding energy spectra of copper $Cu2p_{3/2}$. The graph for AlkNaK presents a $Cu2p_{3/2}$ peak 5225 that, based on the 933 eV point on a line extending from points of 940 eV to 925 eV, is substantially lower than that of Alk0 or AlkNa. Said AlkNaK peak 5225 has a height in the range from about 0.2 to 0.7 times, preferably in the range from about 0.25 to 0.4 times, more preferably in the range from 0.3 to 0.35 times that of AlkNa and/or that of Alk0. Similarly, FIG. 5D presents XPS data in a range from about 1122 eV to 1114 eV with peaks corresponding to the binding energy of $Ga2p_{3/2}$. The curve for AlkNaK presents a $Ga2p_{3/2}$ peak 5227 with a height in the range from about 0.1 to 0.7 times, preferably in the range from about 0.2 to 0.4 times, more preferably in the range from 0.22 to 0.32 times that of AlkNa and/or that of Alk0.

Figure 5C:
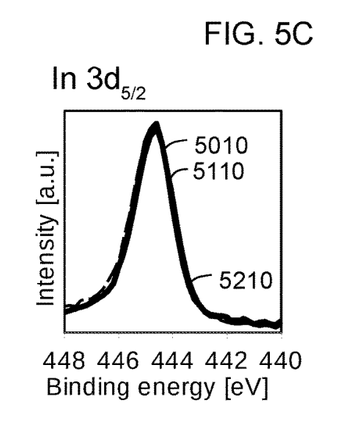
Figure 5D:
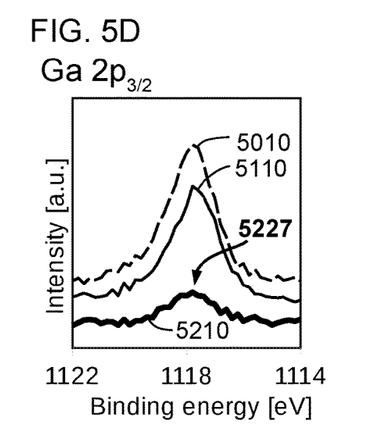
Figure 5E:
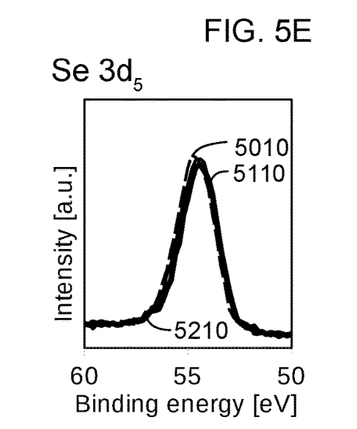

FIGS. 5C and 5E present XPS peaks of about the same height for AlkNaK and AlkNa for $In3d_{5/2}$ (range 448 eV to 440 eV) and $Se3d5$ (range 60 eV to 50 eV).

Of importance to summarize FIGS. 5A to 5E is the change in area under the peaks of the AlkNaK curve with respect to the peaks of the AlkNa or Alk0 curves. This is expressed in Table 3 to reflect the percent of change from AlkNa or Alk0 to AlkNaK.

TABLE 3

| | Area change from AlkNa or Alk0 to AlkNaK for element binding spectra | | |
|---|---|---|---|
| | Area change from AlkNa or Alk0 to AlkNaK (%) | | |
| | Range from-to | Pref. range from-to | Most pref. range from-to |
| $Cd3d_{5/2}$ | 40-2000 | 200-1500 | 500-1000 |
| $Cu2p_{3/2}$ | −10−−100 | −40−−100 | −60−−90 |
| $In3d_{5/2}$ | −30-30 | −20-20 | −10-10 |
| $Ga2p_{3/2}$ | −10−−100 | −40−−100 | −60−−90 |
| $Se3d5$ | −30-30 | −20-20 | −10-10 |

FIGS. 6A to 6D present a scanning electron microscope (SEM) image and its subsequent processing to obtain statistical information on the modified surface of absorber layer 130.

Figure 6A:
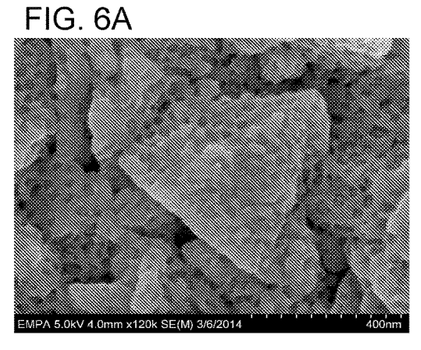
FIGS. 6A-6F are electron microscopy images of absorber surface regions showing examples of cavities and indications for the method used to evaluate their distribution.

FIG. 6A is an SEM image of the surface of absorber layer 130. The state of the surface of absorber layer 130 corresponds to that obtained after at least one of the steps of aqueous wetting 237 or treating absorber surface 238. The state is ordinarily observed prior to the step of forming buffer layer 240 and more preferably prior to the step of forming front-contact layer 250. A person skilled in the art will know that solutions that may be used for the step of forming buffer layer 240 may contribute to forming cavities 610, 612, 613. However, for example, if the buffer layer comprises cadmium sulfide and the buffer layer contributes overall thickness to the device's thin-film, the cadmium sulfide will fill the cavities and ordinarily reduce or prevent the visibility of cavities upon analysis with scanning electron microscopy of the surface of the absorber layer. The surface of absorber layer 130 is characterized in that it comprises cavities 610, 612, 613, as designated in FIG. 6B. Said cavities are ordinarily not visible after forming front-contact layer 250. A person skilled in the art will be able to obtain images over ranges of working distances from the SEM's electron optical column, absorber surface orientations with respect to the axis of the SEM's electron gun, electron beam energies, and magnifications.

Figure 6B:
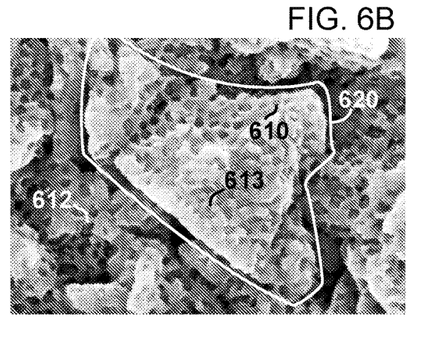

FIG. 6B is FIG. 6A following digital image contrast enhancement. A person skilled in the art may use various contrast or feature enhancing algorithms to assist collection of statistical data. Cavities 610 are ordinarily visible using microscopy following at least the step of treating absorber surface 238. Cavities 610, 612, 613 are visible as darker areas formed as shapes resembling at least one square. Some cavities 612, 613 can be seen as formed by aggregates of squares and may have rectangular shapes or more complex shapes depending on the orientation of the multiple aggregated squares. Said cavities result from selectively dissolving away from the surface of absorber layer 130 of at least one crystal aggregate comprising at least one alkali crystal. Said at least one alkali crystal preferably comprises potassium. Said alkali crystals are ordinarily formed as cubic crystals or compounds of cubic crystals. Dissolving of said cubic crystals or compounds of cubic crystals embedded within the surface of the absorber layer therefore results in square-like cavities which may appear as aggregates. A white line has been drawn over the image by the investigator to highlight a grain facet 620 of absorber layer 130. The information bar supplied by the scanning electron microscope in FIG. 6A is cropped out.

Figure 6C:
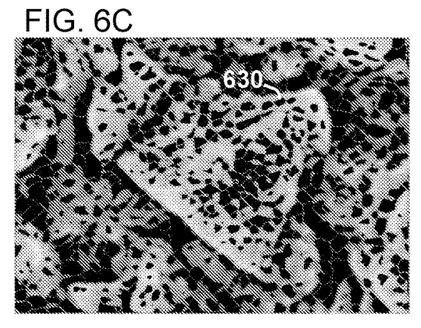

FIG. 6C is FIG. 6B following further digital image processing. The image is resized to a preferred width in pixels. The image is also smoothed. An image segmentation algorithm implemented in a digital computer program is then applied to locate, mark, and obtain statistical information on cavities. A person skilled in the art of image processing and image segmentation will know that adjusting image processing parameters requires supervised tests on a few image samples of a given manufacturing process to obtain correct image segmentation and statistical data. FIG. 6C shows how cavity 610 has been darkened by cavity mark 630. The plurality of cavity marks may be used to obtain statistical information about the cavities 610, 612, 613 on the surface of absorber layer 130.

Figure 6D:
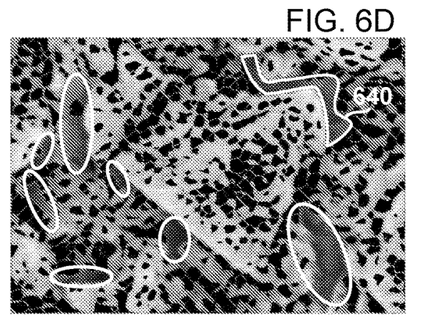

FIG. 6D is FIG. 6C following removal of some cavity marks. Cavity marks may be removed in crevices at the periphery of grain facets. Oversize cavity marks may also be removed. Removal of cavity marks may be done manually and/or automatically. Some cavity marks may for example be removed based on thresholds on size. Other cavity marks may be removed based on grey level intensity or other pattern recognition methods, such as grain identification conducted at a larger scale. Areas where cavity marks have been removed are designated by white contours 640.

As an example for FIGS. 6A to 6D, the image in FIG. 6A is obtained by placing at least the absorber layer 130 at a working distance of about 4 mm and with the surface of absorber layer 130 facing the electron gun and having an orientation that is perpendicular to the gun's axis. The electron beam energy is set to 5 kV. Magnification is set at 120,000. In FIG. 6B the contrast is enhanced by digital image histogram equalization. In FIG. 6C the image is resized to a width of 800 pixels. In FIG. 6C the image is smoothed by convolution with a two-dimensional continuous wavelet transform based on a Gaussian wavelet that is in the range from about 5 pixels to 12 pixels wide, preferably about 5 to 10 pixels wide. The image segmentation algorithm is a watershed algorithm (Beucher S. (1991) The watershed transformation applied to image segmentation, In 10th Pfefferkorn Conf. on Signal and Image Processing in Microscopy and Microanalysis, 16-19 Sep. 1991, Cambridge, UK, Scanning Microscopy International, suppl. 6. 1992, pp. 299-314). The watershed algorithm is implemented in the Gwyddion software program, a free, open source, and cross-platform software (Gwyddion 2.26, retrieved 2014 Apr. 30 from <URL: www.gwyddion.net>). Parameters fed into the watershed algorithm via the Gwyddion software are, with inverted height, for the grain location stage, a number of steps of about 20, a drop size of about 0.3, and a threshold of about 5 pixels squared and, for the segmentation stage, a number of steps of 80, and a drop size of 3.0 provide results in Table 3. Ranges for various watershed analysis results that may be helpful to guide the person skilled in the art towards manufacturing photovoltaic devices according to the invention are provided in Table 4.

TABLE 4

Watershed image processing results for FIGS. 6A to 6D

| Watershed image processing results | All marked cavities (FIG. 6C) | Some marks removed (FIG. 6D) |
|---|---|---|
| Image dimensions (nm) | 1055 × 738.5 | 1055 × 738.5 |
| Image resolution (pixels) | 800 × 560 | 800 × 560 |
| Number of cavities | 658 | 620 |

TABLE 4-continued

Watershed image processing results for FIGS. 6A to 6D

| Watershed image processing results | All marked cavities (FIG. 6C) | Some marks removed (FIG. 6D) |
|---|---|---|
| Number of cavities per unit area | 845/$\mu m^2$ | 796/$\mu m^2$ |
| Total projected area (absolute) | 297 × $10^{-15}$ $m^2$ | 243 × $10^{-15}$ $m^2$ |
| Total projected area (relative) | 38.08% | 31.16% |
| Mean cavity area | 0.45 × $10^{-15}$ $m^2$ | 0.39 × $10^{-15}$ $m^2$ |
| Mean cavity size | 18.4 nm | 17.4 nm |
| Grain area sample variance | 2.51 × $10^{-31}$ | 1.36 × $10^{-31}$ |

TABLE 5

Ranges for Watershed image processing results

| Watershed image processing results | Some marks removed | | |
|---|---|---|---|
| | Range from-to | Pref. range from-to | More pref. range from-to |
| Image dimensions (nm) | 1055 × 738.5 | 1055 × 738.5 | 1055 × 738.5 |
| Image resolution (pixels) | 800 × 560 | 800 × 560 | 800 × 560 |
| Number of cavities | 1-3000 | 100-1200 | 200-800 |
| Total projected area (relative) | 15%-80% | 20%-60% | 24%-45% |

A person skilled in the art wishing to evaluate results derived from an apparatus manufactured according to the method, or wishing to compare image analysis software may, for calibration purposes, use the image of FIG. 6A or the freely available texture image 1.5.03 "Rough wall" available from the University of Southern California Signal and Image Processing Institute USC-SIPI Image Database, retrieved 2014 Apr. 30 from <URL: http://sipi.usc.edu/database/download.php?vol=textures&img=1.5.03>. Image 1.5.03 processed using the Watershed algorithm in Gwyddion, processed in the same way and parameters as for images 6A to 6C, provides results in Table 5.

TABLE 6

Watershed image processing results for USC-SIPI image 1.5.03 "Rough wall"

| Watershed image processing results | USC-SIPI image 1.5.03 |
|---|---|
| Arbitrary image dimensions (mm) | 100 × 100 |
| Image resolution (pixels) | 512 × 512 |
| Number of cavities | 516 |
| Total projected area (absolute) | 3.44 × $10^{-3}$ $m^2$ |
| Total projected area (relative) | 34.43% |
| Mean cavity area | 6.7 $mm^2$ |
| Mean cavity size | 2.31 mm |

From Watershed image segmentation on a range of samples manufactured according to the present invention, a person skilled in the art may specify ranges that characterize the surface of absorber layer 130 following at least one of bathing in diluted ammonia 237 or treating absorber surface 238.

Figure 6E:
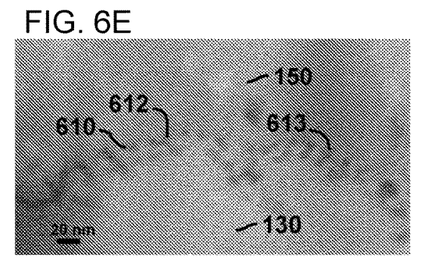

FIG. 6E presents a transmission electron microscope (TEM) image of a cross-section of PV device detailing the area where a plurality of cavities, three of which are indicated as 610, 612, and 613, are comprised at least between absorber layer 130 and front-contact layer 150. The image shows that cavities are visible as darker squares of about 5 nm or compounds of squares in the range of about 5 nm to 40 nm.

Figure 6F:
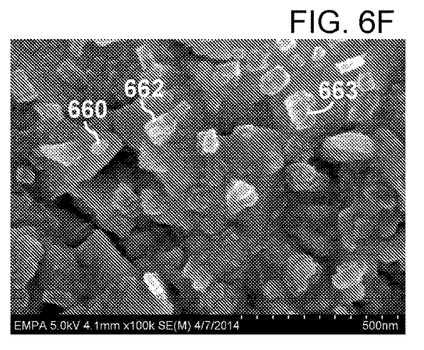

FIG. 6F presents an SEM image of the surface of absorber layer 130 comprising a plurality of alkali crystals, three of which among a plurality are indicated for illustrative purposes as 660, 662, and 663. The image of FIG. 6F was obtained prior to subjecting the surface of the absorber layer to the step of forming cavities 236. The image also shows that said alkali crystals are aggregates of cubic crystals with width ranging from about 10 nm to 50 nm, more commonly about 20 nm. Said alkali crystal aggregates have a greatest width ranging from about 20 nm to 200 nm, more commonly about 100 nm. Alkali crystal aggregates visible in the image are partly embedded into the surface of the absorber layer. The visible alkali crystal aggregates 660, 662, 663, are formed as a result of the steps of forming absorber layer 230 and adding at least one alkali metal 235, one of said alkali metal comprising potassium. The composition of the material directly in contact with the alkali crystals may be modified due to a higher local concentration of alkali elements. For example, the composition of the absorber layer directly in contact with the alkali crystals may be rich in alkali elements. As a more precise example, if one of the at least one alkali elements supplied is potassium, then the composition of the absorber layer directly in contact with an alkali crystal may be potassium rich. A plurality of alkali crystals and alkali crystal aggregates are selectively dissolved by the step of forming cavities 236. Furthermore, portions of material, for example absorber material, directly in contact with said crystal may also be dissolved by the step of forming cavities 236. It is also possible that a plurality of alkali crystals and alkali crystal aggregates that are completely embedded under the surface of the absorber layer and therefore not visible in FIG. 6F are dissolved by the step of forming cavities 236.

Figure 7:
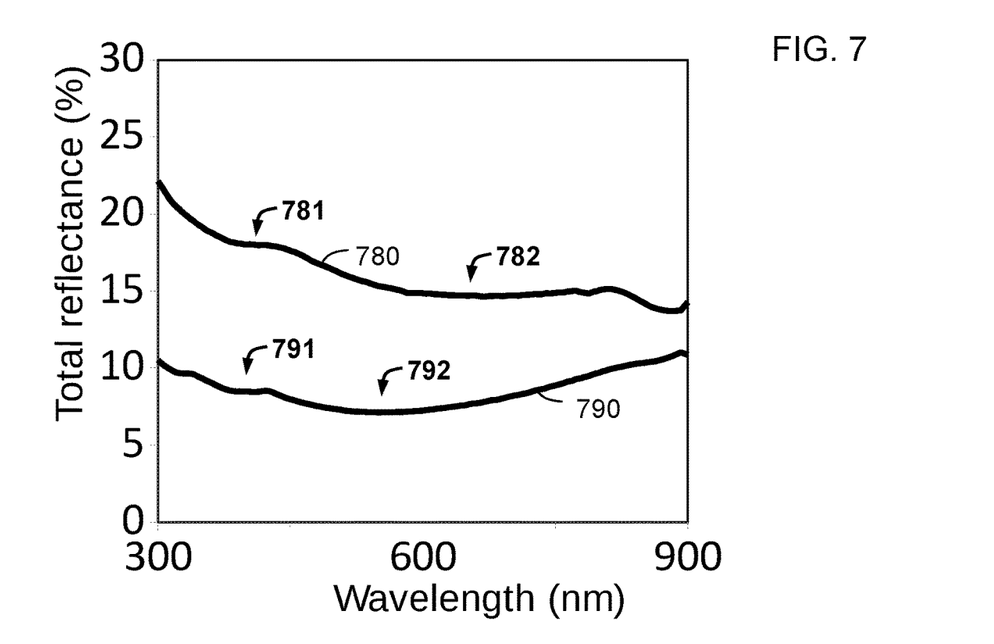
FIG. 7 is a graph of device reflectance as a function of wavelength prior to forming a front-contact layer.

FIG. 7 is a graph of device reflectance as a function of wavelength prior to forming a front-contact layer 250, 150. It enables a comparison between a first device where adding at least one alkali metal 235 does not comprise potassium, thereby resulting in the first reflectance curve 780 for a non-potassium comprising device, and a second device where adding at least one alkali metal 235 comprises potassium, thereby resulting in the second reflectance curve 790 for a potassium comprising device. As an example for FIG. 7, the reflectance curve for a non-potassium comprising device 780 is for a device where adding at least one alkali metal 235 comprises adding sodium fluoride (NaF) only, and the reflectance curve for a potassium comprising device 790, a best mode device, is for a device where adding at least one alkali metal 235 comprises adding NaF and KF. The first reflectance curve shows a decreasing reflectance from about 23% at a wavelength of 300 nm to about 14% at 900 nm. Said first reflectance curve also comprises at least two zones 781, 782 of about constant reflectance. A first zone 781 is at about 18% from about 380 nm to about 440 nm and a second zone 782 at about 15% from about 580 nm to about 800 nm. The second reflectance curve shows a decreasing reflectance from about 11% at a wavelength of 300 nm to about 7% at 550 nm, followed by an increasing reflectance to about 12% at 900 nm. Said second curve also comprises at least two zones 791, 792 of about constant reflectance. A first zone 791 is at about 18% from about 380 nm to about 440 nm and a second zone 792 at about 7% from about 500 nm to about 600 nm. The overall reflectance of the first device is therefore lower than that of the second device.

Although the step of forming a front-contact layer 250, 150, and especially the thickness of said layer has an effect on the reflectance and color of a device, a person skilled in the art may wish to adjust the amount and composition of alkali metals in the step of adding at least one alkali metal 235 so as to contribute to the design of the device's optical properties or to the selection of a color for the PV device after the step of forming front-contact layer 250 has been completed. One may therefore devise a method of selecting the color of a PV device and/or its reflectance by adjusting the amount and/or composition of the at least one alkali metal in the step of adding the at least one alkali metal.

Figure 8:
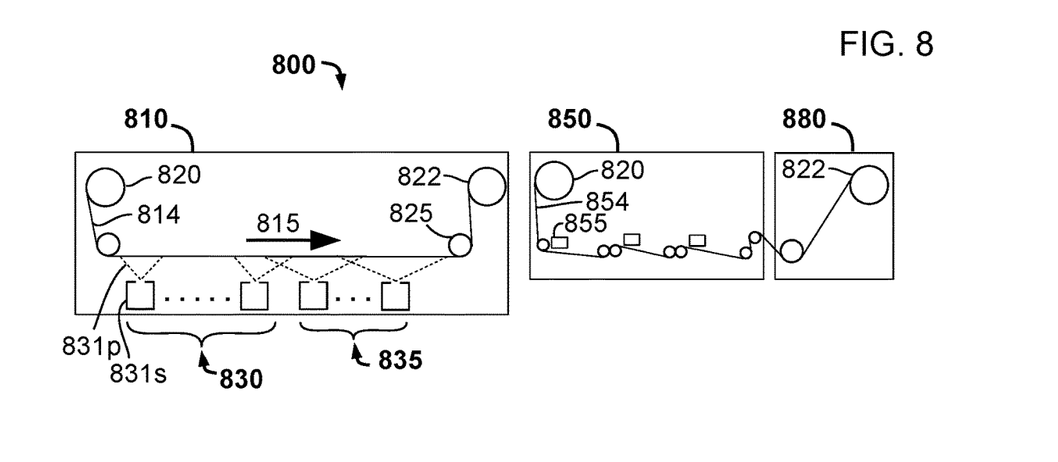
FIG. 8 is a schematic side view for an apparatus for carrying out the method of fabricating thin-film optoelectronic devices.

FIG. 8 presents an apparatus 800 for carrying out the method of fabricating thin-film optoelectronic devices 100, 200. The apparatus comprises at least one system for forming at least one absorber layer and adding at least one alkali metal 810 and at least one system for forming cavities 850. Said apparatus may also comprise other subsystems 880 for completing any of the steps of short drying 242, annealing 244, degassing 246, or forming front-contact layer 250. Said apparatus 800 may be a roll-to-roll system for coating of flexible substrates.

For example, the system for forming at least one absorber layer and adding at least one alkali metal 810 comprises means 820 for providing a substrate 110 with a back-contact layer coating 120. For a roll-to-roll system, said means 820 for providing a substrate 814 may be a payout reel 820. Said system coats the back-contact layer coating side of said substrate with at least one absorber layer 130 made of an ABC chalcogenide material, including ABC chalcogenide material quaternary, pentanary, or multinary variations, wherein A represents elements of group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te. Said substrate may for example be coated by a plurality of evaporation sources 831s providing material to the substrate via evaporation plumes 831p. Said plumes may overlap on the surface of the substrate. Said evaporation sources may be arranged in blocks 830, 835, wherein, for example, a first block 830 dispenses material for the step of forming the absorption layer 130, 230 and a second block 835 dispenses material for adding at least one alkali metal 235 as the substrate moves in direction 815 over said sources. Said substrate may pass through a plurality of rollers 825, such as tensioning rollers, and be collected by a take-up reel 822.

The system for forming cavities 850 comprises, for example, a payout reel 820 for providing a substrate 854 comprising an absorber layer 130. Said system comprises means for forming cavities. The system may for example comprise at least one wetting or bathing device 855 for at least one of the steps of forming cavities 236, namely aqueous wetting 237, treating absorber layer surface 238, or forming a buffer layer 240. An advantageous solution may be for the system to comprise a plurality of wetting devices 855, for example waterfall wetting devices, showering devices, spraying devices, humidifying devices, or bathing devices, thereby enabling a plurality of steps for forming cavities within the same system. A person skilled in the art may also devise an apparatus where the substrate continuously transfers, for example without intermediate take-up reels, from a first system to a second system.

The invention claimed is:

1. A method of fabricating thin-film optoelectronic devices, the method comprising:

providing a substrate;
forming a back-contact layer;
forming at least one absorber layer, which absorber layer is made of an ABC chalcogenide material, wherein A represents one or more elements selected from a group consisting of Cu and Ag, B represents one or more elements selected from a group consisting of In, Ga, and Al, and C represents one or more elements selected from a group consisting of S, Se, and Te;
adding at least one alkali metal; and
forming at least one cavity at a surface of the absorber layer by dissolving away from said surface of the absorber layer at least one crystal aggregate comprising at least one alkali crystal comprising at least one alkali metal.

2. The method according to claim 1, wherein the at least one alkali metal comprises potassium.

3. The method according to claim 1, further comprising a step of aqueous wetting of at least the surface of the absorber layer with a diluted aqueous ammonia solution with a diluted ammonia molarity in a range from 0.1 to 20 M.

4. The method according to claim 1, further comprising a step of treating the surface of the absorber layer by adding oxidation state +1/+2 elements to the surface of the absorber layer.

5. The method according to claim 1, wherein the at least one absorber layer is $Cu(In,Ga)Se_2$.

6. The method according to claim 1, further comprising forming at least one front-contact layer.

7. The method according to claim 1, wherein a reflectance of the thin-film optoelectronic device is adjusted by adjusting an amount of at the least one alkali metal in the step of adding the at least one alkali metal.

8. The method according to claim 1, wherein said substrate is conveyed between a delivery roll and a take-up roll of a roll-to-roll manufacturing apparatus.

9. A method of fabricating thin-film optoelectronic devices, the method comprising:
providing a substrate;
forming a back-contact layer;
forming at least one absorber layer, which absorber layer is made of an ABC chalcogenide material, wherein A represents one or more elements selected from a group consisting of Cu and Ag, B represents one or more elements selected from a group consisting of In, Ga, and Al, and C represents one or more elements selected from a group consisting of S, Se, and Te;
adding at least one alkali metal, wherein adding the at least one alkali metal causes at least one crystal aggregate comprising at least one alkali crystal to form on a surface of the absorber layer;
forming at least one cavity at the surface of the absorber layer by dissolving away from said surface of the absorber layer the at least one alkali crystal, wherein the forming at least one cavity comprises:
wetting at least the surface of the absorber layer with an aqueous solution comprising ammonia; and
then forming a buffer layer over the surface of the absorber layer, wherein the buffer layer comprises an element selected from the group of cadmium, zinc, indium and gallium.

10. The method of claim 9, wherein the at least one alkali metal comprises potassium.

11. The method of claim 10, wherein the adding at least potassium comprises adding at least one of the group consisting of KF, KCl, KBr, KI, $K_2S$, and $K_2Se$.

12. The method of claim 9, wherein the solution comprising ammonia comprises a solution with a diluted ammonia molarity in a range from 0.1 to 20 M.

13. The method of claim 9, wherein forming the least one cavity at the surface of the absorber layer further comprises treating the surface of the absorber layer with a solution comprising cadmium and ammonia before forming the buffer layer over the surface of the absorber layer.

14. The method of claim 13, wherein the solution comprising cadmium and ammonia comprises an ammonia solution molarity in the range of 1 mol/L to 30 mol/L.

15. The method of claim 13, wherein the solution comprising cadmium and ammonia comprises a cadmium solution molarity in the range of 0.00001 mol/L to 10 mol/L.

16. The method of claim 13, wherein the forming at least one cavity further comprises adding oxidation state +1/+2 elements to the surface of the absorber layer.

17. The method of claim 9, wherein the solution comprising ammonia comprises a diluted aqueous ammonia solution with a diluted ammonia molarity in a range from 0.1 to 20 M.

18. The method of claim 9, wherein the substrate comprises polyimide.

19. The method of claim 9, wherein the adding at least one alkali metal is done in the presence of at least one or more elements selected from a group consisting of S, Se, and Te.

* * * * *